United States Patent
Poechmueller

(10) Patent No.: US 7,231,488 B2
(45) Date of Patent: Jun. 12, 2007

(54) SELF-REFRESH SYSTEM AND METHOD FOR DYNAMIC RANDOM ACCESS MEMORY

(75) Inventor: Peter Poechmueller, Unterhaching (DE)

(73) Assignee: Infineon Technologies AG, Munich (DE)

( * ) Notice: Subject to any disclaimer, the term of this patent is extended or adjusted under 35 U.S.C. 154(b) by 332 days.

(21) Appl. No.: 10/663,151

(22) Filed: Sep. 15, 2003

(65) Prior Publication Data

US 2005/0060488 A1 Mar. 17, 2005

(51) Int. Cl.
G06F 12/00 (2006.01)

(52) U.S. Cl. .................. 711/106; 711/105; 365/222

(58) Field of Classification Search ............ None
See application file for complete search history.

(56) References Cited

U.S. PATENT DOCUMENTS

| 5,283,885 | A | 2/1994 | Hollerbauer | |
|---|---|---|---|---|
| 5,991,218 | A | 11/1999 | Kushiyama | |
| 6,199,139 | B1 * | 3/2001 | Katayama et al. | 711/106 |
| 6,310,813 | B1 * | 10/2001 | Bae | 365/222 |
| 6,473,355 | B2 * | 10/2002 | Caulkins | 365/228 |
| 6,483,764 | B2 | 11/2002 | Chen Hsu et al. | |
| 6,577,546 | B2 | 6/2003 | Fujiwara et al. | |
| 6,778,457 | B1 * | 8/2004 | Burgan | 365/222 |
| 6,838,331 | B2 * | 1/2005 | Klein | 438/238 |
| 6,894,941 | B2 * | 5/2005 | Kurjanowicz et al. | 365/222 |
| 2002/0105845 | A1 | 8/2002 | Hidaka | |
| 2003/0043674 | A1 * | 3/2003 | Feurle et al. | 365/222 |

OTHER PUBLICATIONS

"McGraw-Hill Dictionary of Scientific and Technical Terms," Fourth Edition, 1989, p. 1837.

* cited by examiner

Primary Examiner—Jasmine Song
(74) Attorney, Agent, or Firm—Slater & Matsil, L.L.P.

(57) ABSTRACT

A system and method are provided for reducing a rate for refreshing a portion of a dynamic random access memory (DRAM). The method includes storing a information for distinguishing between a first portion of a DRAM requiring refresh at a first rate and a second portion of said DRAM permitting refresh at a second rate lower than the first rate. The stored information is then accessed to refresh the first portion of the DRAM at the first rate and to refresh the second portion at the second rate. The information can be generated from post-fabrication stress testing such that most of the DRAM can be refreshed at the lower rate and only the portion requiring more frequent refresh is refreshed at the higher rate.

19 Claims, 3 Drawing Sheets

SELF-REFRESH SYSTEM AND METHOD FOR DYNAMIC RANDOM ACCESS MEMORY

BACKGROUND OF THE INVENTION

The present invention relates to integrated circuit memories and more specifically to a system and method for refreshing a dynamic random access memory (DRAM).

Recently, there is much interest in using DRAMs in a variety of hand-held portable devices such as mobile communication devices, game units and personal digital assistants, mainly because of the greater amount of integration density that can be achieved over other types of rewriteable integrated circuit memory such as static random access memory (SRAM). In addition, DRAMs generally provide faster access time than some non-volatile types of rewriteable memory such as flash memory, and can be written at considerably lower voltages than those required for flash memory.

However, owing to their compact design of having a single transistor and a storage capacitor per storage cell, DRAMs require refreshing in order to prevent the data stored in the storage cells from disappearing as a leakage current from the storage capacitor of each storage cell. During refresh, a data bit signal is read from each storage cell, then amplified to full logic levels and is then restored to the storage cell.

Different storage cells of a DRAM can tolerate being refreshed at different rates. Variations in the manufacturing process within tolerances can result in the storage cells of particular portions of the DRAM having greater or less leakage current. Some storage cells of the DRAM, because of their marginal characteristics, may require refreshing at the conventional rate of once every 64 msec. However, other storage cells of the DRAM may require refreshing only at much less frequent intervals, for example, 128 msec, 256 msec, 512 msec, or at intervals extending into seconds. Conventionally, all storage cells of a DRAM are refreshed at the same refresh rate. Because of this, it is apparent that the refresh rate must be set at the point required by the weakest storage cell of the DRAM.

While conventional refreshing at a single rate is acceptable for DRAMs installed in systems having much available power, such is not desirable for portable devices, due to the need to extend battery charge by conserving power. This is especially important for extending the standby time of portable devices such that data can be maintained in DRAM of the portable device for a desirably long time.

Standard DRAMs of 256 K capacity draw refresh currents in the range of 500 µA. This is based upon refreshing the entire DRAM at the conventional refresh interval of 64 msec. Such refresh currents are unacceptably high for a portable device, since they are always present during both an active mode of the DRAM and a sleep mode when provided in the DRAM, regardless of whether a user is actively using the portable device or not. Conventionally, lower refresh currents are obtained only when the DRAM or portions thereof are switched off.

As used herein in connection with a DRAM and particular portions thereof, the term "active mode" means the operational state in which data can be stored to and accessed from the DRAM, or the particular portions thereof.

As used herein in connection with a DRAM and particular portions thereof, the term "sleep mode" means the operational state in which data remains stored in a DRAM or particular portions thereof subject to being refreshed, but in which mode data cannot be stored to and accessed from the DRAM or the particular portions thereof.

As used herein in connection with a DRAM and particular portions thereof, the term "switched off" means the state in which power that is input to the DRAM or particular portions thereof, is either removed from the DRAM or set to a level that is insufficient for the DRAM to reliably store data.

FIG. 1 illustrates a DRAM 10 in which conventional refreshing is performed. As illustrated in FIG. 1, the DRAM 10 includes four segments 12, 14, 16, and 18, a row decoder/driver unit 20 for activating wordlines of each segment of the DRAM, and a refresh controller 22 having self-refresh logic and a counter for controlling the addresses and timing at which portions of the DRAM are refreshed.

During refreshing, the refresh controller 22 causes row decoder/driver unit 20 to activate a wordline of a segment 12, 14, 16, or 18, at which time signals representing data bits stored in storage cells accessed by the particular wordline are read out, amplified to full logic levels and then restored to the storage cells. Thereafter, the refresh controller 22 does the same for the next wordline in sequence, and then the next one thereafter, until all of the storage cells accessed by all of the wordlines have been refreshed for all of the segments. In this conventional arrangement, the storage cells of all of the wordlines are refreshed at the same refresh rate, i.e., once every 64 msec.

Because different portions of a DRAM require more or less frequent refreshing, it would be desirable to provide a way of distinguishing between respective portions of a DRAM in which one portion requires a first refresh rate and another portion which can be refreshed at a rate which is lower than the first refresh rate.

Further, it would be desirable to refresh the respective portions of a DRAM so distinguished from each other at different rates.

SUMMARY OF THE INVENTION

Therefore, according to an aspect of the invention, a method is provided for reducing a rate for refreshing a portion of a dynamic random access memory (DRAM). According to such aspect, information is stored for distinguishing between a first portion of a DRAM requiring refresh at a first rate and a second portion of the DRAM permitting refresh at a second rate lower than the first rate. The information is then accessed to refresh the first portion at the first rate and to refresh the second portion at the second rate.

According to a preferred aspect of the invention, the first portion and the second portion each include one or more segments of the DRAM, and the information distinguishes between the first portion and the second portion on the basis of the segments.

According to another preferred aspect of the invention, the first portion includes subportions, at least some of the subportions being physically discontiguous. The subportions are preferably wordline spaces of the DRAM such that the information distinguishes between the first portion and the second portion on the basis of the wordline spaces.

According to a preferred aspect of the invention, the first portion is refreshed at the first rate and the second portion is refreshed at the second rate while both the first portion and the second portion operate in a mode selected from the group consisting of active mode and sleep mode.

According to a further preferred aspect of the invention, the information is stored in the DRAM. Preferably, the information is further stored in a non-volatile memory and accessed from the non-volatile memory for storage in the DRAM.

According to a different preferred aspect of the invention, the information is stored in one or more fuses on an integrated circuit including the DRAM.

According to yet another preferred aspect of the invention, the information further allows a plurality of portions numbering one to n of the DRAM including the first portion and the second portion to be distinguished for refreshing the plurality of portions of the DRAM at a plurality of respective rates numbering one to n, and the stored information is accessed to refresh the plurality of portions at the respective rates including to refresh the first portion at the first rate, to refresh the second portion at the second rate, and to refresh the nth portion at the nth rate.

According to another preferred aspect of the invention, the information is stored in a wordline space accessible through one or more wordlines of the DRAM.

In yet another preferred aspect of the invention, the information is generated by post-fabrication stress testing of the DRAM.

According to another aspect of the invention, an integrated circuit is provided including a dynamic random access memory (DRAM). According to this aspect of the invention, the DRAM includes a first portion requiring refresh at a first rate and a second portion permitting refresh at a second rate lower than the first rate. The DRAM further includes electronic means operable to store a information for distinguishing between the first portion and the second portion. A controller is provided which is operable to access the stored information from the electronic means to refresh the first portion at the first rate and to refresh the second portion at the second rate.

According to a preferred aspect of the invention, the first portion and the second portion each include one or more segments of the DRAM, such that the information allows the first portion and the second portion to be distinguished on the basis of the segments.

According to yet another preferred aspect of the invention, the first portion includes subportions, wherein at least some of the subportions are physically discontiguous. Preferably, the subportions are wordline spaces of the DRAM such that the information allows the first portion and the second portion to be distinguished on the basis of the wordline spaces.

In another preferred aspect of the invention, the controller is operable to refresh the first portion at the first rate and to refresh the second portion at the second rate while both the first portion and the second portion operate in a mode selected from the group consisting of active mode and sleep mode.

According to another preferred aspect of the invention, the electronic means is located within the DRAM. Preferably, the controller is further operable to access first information from a non-volatile memory and the electronic means is further operable to store the information for distinguishing between the portions of the DRAM from the first information. The electronic means can include one or more fuses.

According to yet another preferred aspect of the invention, the information further allows a plurality of portions numbering one to n of the DRAM including the first portion and the second portion to be distinguished for refreshing the plurality of portions of the DRAM at a plurality of respective rates numbering one to n, and the controller is operable to refresh the plurality of portions at the respective rates including to refresh the first portion at the first rate, to refresh the second portion at the second rate, and to refresh the nth portion at the nth rate.

In another preferred aspect of the invention, the electronic means includes a wordline space accessible through one or more wordlines of the DRAM.

DETAILED DESCRIPTION

The embodiments of the invention will now be described with reference to FIGS. 2 through 6.

Figure 1:
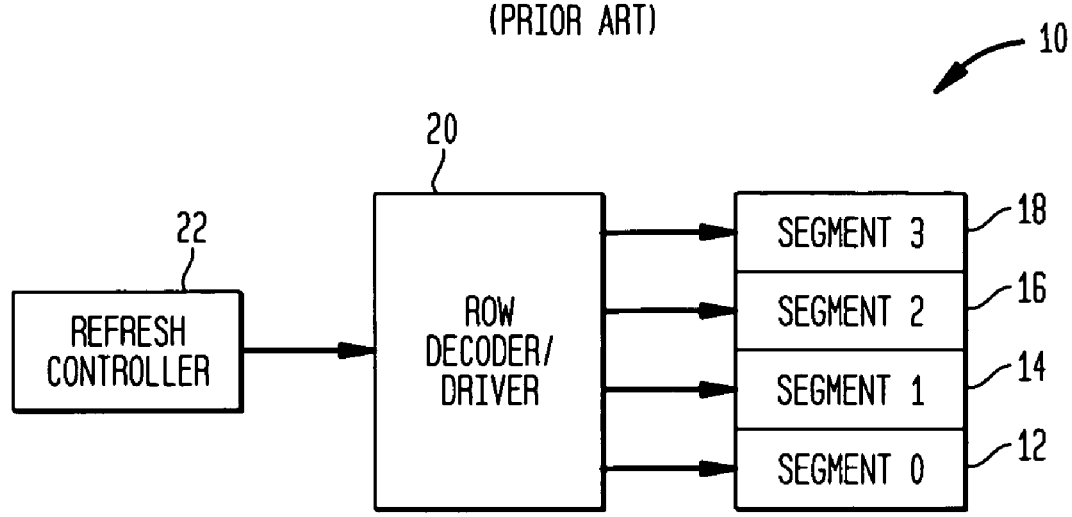
FIG. 1 is a block and schematic diagram illustrating a prior art DRAM.
Figure 2:
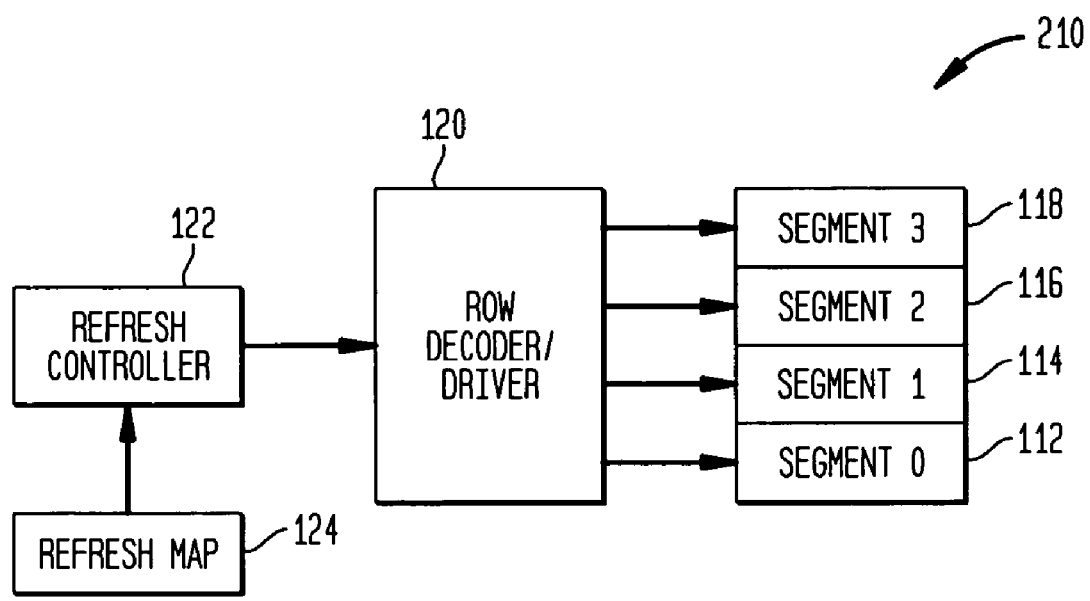
FIG. 2 is a block and schematic diagram illustrating an embodiment of the invention.

FIG. 2 is a block and schematic diagram illustrating an embodiment of the invention. As shown in FIG. 2, a refresh map 124 is coupled to refresh controller 122 having self-refresh logic and a counter for automatically refreshing a plurality of data storage arrays of a DRAM, as represented by segments 112, 114, 116 and 118. The refresh map 124 stores information for distinguishing between a first portion of the DRAM requiring refresh at a first rate and a second portion of the DRAM which is permitted to be refreshed at a second rate lower than the first rate. All other elements of FIG. 2 are the same as those shown in the prior art diagram of FIG. 1.

The information distinguishing the different portions of the DRAM based on required refresh interval is typically determined as a result of post-fabrication stress testing, generally performed before the integrated circuit that houses the DRAM is packaged and installed for normal operation. The DRAM can be a stand-alone DRAM or an embedded element within an integrated circuit having a broader function such as a system chip.

The refresh map 124 can be implemented in any of a variety of ways. For example, the refresh map 124 can include a plurality of fuses. Information is stored on the fuses according to the state of the fuses (blown, unblown). Fuses are typically blown during and/or following post-fabrication stress testing, prior to the integrated circuit being packaged and installed for operation. The fuses can be of any type such as, for example, laser fuse, electrical fuse or electrical anti-fuse. Some types of fuses, e.g. electrical and electrical anti-fuse, can be blown either before or after packaging and possibly after installation of the integrated circuit. In an example, one fuse is provided for each of the four segments 112, 114, 116 and 118 of the DRAM. A blown fuse illustratively indicates a segment of the memory requiring the most frequent refresh, for example, refreshing once per the most frequent refresh interval of 64 msec. By contrast, an unblown fuse illustratively indicates a segment of the memory permitting less frequent refreshing at a default lower rate. In such example, a portion of a DRAM that is not indicated by a blown fuse is refreshed at a lower refresh rate by default. The default lower refresh rate preferably corresponds to an integral multiple of the most frequent refresh interval. Thus, in an example, the default lower rate can be once every 128 msec. In another example, the default lower refresh rate can be once every 256 msec. In other examples, the default lower rate can correspond to even higher multiples of the most frequent refresh interval.

In still other examples, the default lower refresh rate need not correspond to an integral multiple of the most frequent refresh interval. On the contrary, the two refresh rates can be determined independently from each other. However, when the default lower refresh rate corresponds to an integral multiple of the most frequent refresh interval, controller design and operation are more easily facilitated. When the rates are related in this manner, the most frequent rate can be obtained by refreshing once per a primary refresh interval (at 64 msec, for example), and a lower rate (for example, once per 128 msec.) can be obtained by refreshing at every other primary refresh interval, skipping the primary refresh intervals in between.

In an example, it is not necessary that the portions of the DRAM needing most frequent refreshing be indicated specifically by blown fuses. Instead, unblown fuses can be used to indicate portions of a DRAM which need more frequent refreshing. In such example, blown fuses can be used to indicate portions of a DRAM which need less frequent refreshing.

In yet other examples, a combination of blown and unblown fuses can be used to encode information for distinguishing between the portion of the DRAM requiring more frequent refreshing and the portion permitting less frequent refreshing. For example, in a DRAM which is subdivided eight ways in some manner, e.g. having eight segments, eight banks, eight units, or eight double units, etc., three fuses can be used to encode information for distinguishing one of the eight subdivisions from all others. In such example, suppose that subdivision 3 of the DRAM requires refreshing at the most frequent refresh interval. Then, the three fuses can store the states of "0 1 1", or its complement "1 0 0" ("1" meaning blown, and "0" meaning unblown) to provide a unique signal indicating that subdivision 3 requires most frequent refreshing.

If needed, additional fuses can be used to encode an indicator for distinguishing another subdivision of the DRAM from others. For example, suppose that subdivision 5 of the DRAM also requires refreshing at the most frequent refresh interval. The same kind of encoding will be used as for the first set of fuses. Assume that information is encoded in uncomplemented form for the first set of fuses. For consistency, the three additional fuses encode subdivision 5 in uncomplemented form as the states "1 0 1". Alternatively, if the information on the first set of fuses is encoded in complemented form, the three additional fuses store the states of "0 1 0".

Other mechanisms exist for storing information in non-volatile form for distinguishing between portions of the DRAM at which refreshing is to be performed at different rates. For example, non-volatile types of memory can be used, such as flash memory, or magnetic drive memory. Miniaturized magnetic disk drives are available which are especially adapted for portable electronic devices and are found in devices such as digital cameras and camcorders, for example. In another example, a small subportion of the DRAM can be permanently maintained in either active and/or sleep mode through battery backup power.

Operation of the embodiment illustrated in FIG. 2 is as follows. When the DRAM is powered up, the information stored in the refresh map 124 is made available to the refresh controller 122, which, depending on the quantity of the information, may load all or a part of the information at one time into a register or buffer provided therefor. In an embodiment in which the DRAM is divided into relatively few subdivisions, all of the information can be loaded into the refresh controller 122 at once. For example, as discussed above, a set of fuses can store information for distinguishing which of four segments 112, 114, 116 and 118 require refreshing at the most frequent refresh rate. In another embodiment, the quantity of information loaded from the refresh map 124 can be much greater. For example, if it is desired to distinguish between portions of the DRAM to be refreshed at different rates on a wordline-by-wordline basis, the refresh map 124 can store information as to the particular wordlines requiring the most frequent refresh. As the DRAM may include thousands of wordlines, the information quantity will be much greater.

From the information loaded from the refresh map 124, the refresh controller 122 refreshes respective portions of the DRAM at different rates. For example, in an embodiment in which the refresh map 124 indicates that a segment 116 is to be refreshed at the most frequent refresh rate, refresh controller 122 refreshes that segment 116 at the most frequent rate. By default, the refresh controller 122 refreshes other segments 112, 114 and 118 at a lower refresh rate.

The amount of current saved by refreshing portions of the DRAM at different rates in this manner can be significant. Consider an embodiment in which the DRAM is divided into four segments 112, 114, 116, and 118 of equal capacity, in which only one segment is refreshed at the maximum rate and other segments are refreshed at a lower rate equal to half the maximum rate. Suppose the amount of current needed to refresh all four segments at the maximum rate is 1000 μA. Therefore, one segment requires on average a current of 250 μA to be refreshed at the maximum rate. However, each of the three other segments requires on average a current of only 125 μA to be refreshed at the half-rate. Combining the average current required by all four of the segments, the DRAM is refreshed using a total current of only 625 μA, a savings of 37.5% from the original current required to refresh the DRAM.

Figure 3:
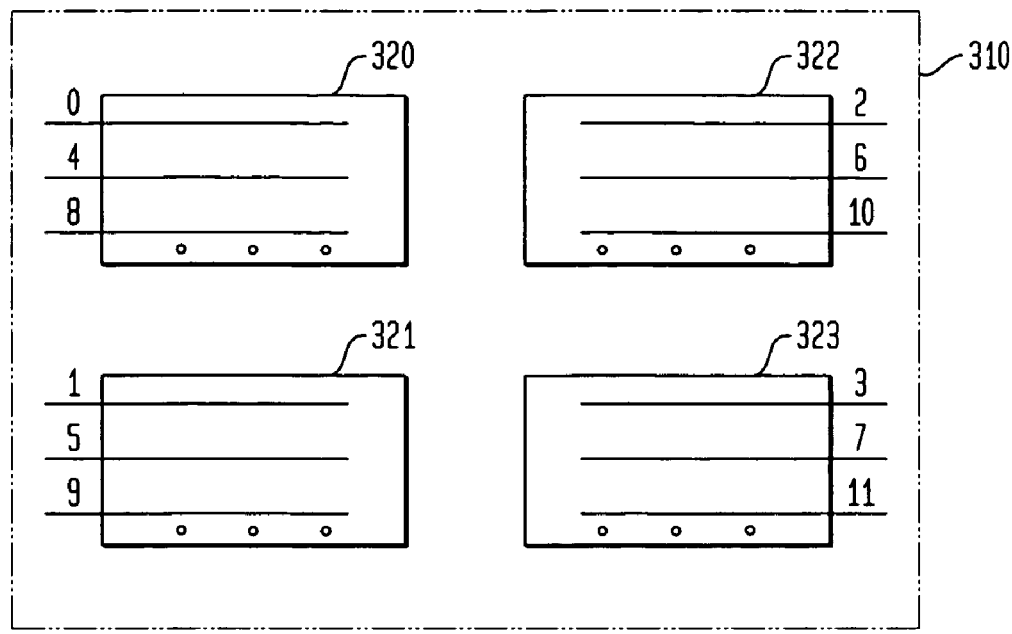
FIG. 3 is a block diagram illustrating a storage array arrangement of a DRAM relative to which an embodiment of the invention is provided.

If the portions of the DRAM to be refreshed at different rates are distinguished with greater granularity, still greater benefits can be achieved. FIG. 3 illustrates a storage array arrangement of a DRAM 310. In such arrangement, the DRAM 310 is divided into a logical organization including a plurality of banks 320, 321, 322, and 323. In each bank, a plurality of wordlines is provided, each wordline accessing a portion of the bank referred to as a "wordline space". Consecutively numbered wordlines are often disposed next to each other in a semiconductor device array such that they access physically contiguous subportions of the DRAM. As used herein, the term "physically discontiguous" means spatially separated on the integrated circuit. Whether they are disposed next to each other or not, the consecutively numbered wordlines in this arrangement access logically discontiguous wordline spaces of different banks, as shown. For example, wordline 0 accesses a wordline space of bank 320, while wordline 1 accesses a wordline space of bank 321.

Figure 4:
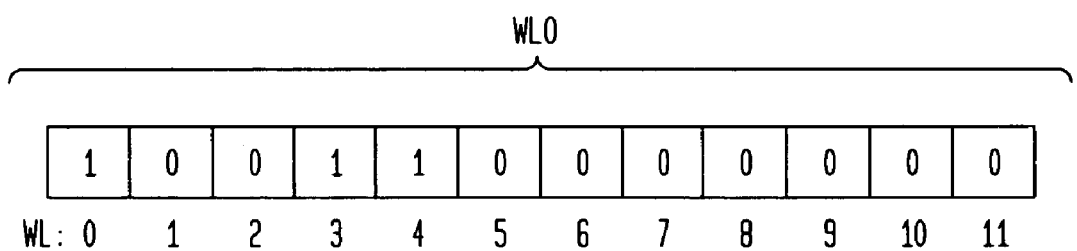
FIG. 4 is a diagram illustrating stored information content of a wordline space utilized in an embodiment of the invention.

Particular benefits arise when information for distinguishing the portions of the DRAM to be refreshed at different rates is stored in the data storage array of the DRAM itself. Because of the DRAM's density and faster access time than other storage from off of the chip, the DRAM is particularly suited to storing high granularity information for this purpose. FIG. 4 illustrates information stored in a wordline space WL0 of the DRAM 310 shown in FIG. 3. The wordline space WL0 is preferably accessed by a single wordline. The information stored in WL0 functions as a refresh map 124 for distinguishing between portions of the DRAM 310 to be refreshed at different rates. Mapping is provided on a wordline-by-wordline basis. As shown in FIG. 4, WL0 has fields indicating the refresh rate for each wordline that it maps (e.g., wordline 0 through wordline 11). In this example, wordlines 0, 3 and 4 are indicated as requiring refresh at the most frequent rate. By contrast, wordlines 1, 2, and 5 through 11 do not require refresh at the most frequent rate.

Operation is provided as follows. In a first refresh pass, the storage cells accessed by all wordlines of the DRAM, e.g. wordlines 0 through 11, are refreshed. This occurs starting at a time of 0 msec in a refresh interval lasting 64 msec. During the next refresh interval starting at time 64 msec. refreshing is performed relative to only some of the wordlines. At the start of this second refresh interval at time 64 msec, the refresh controller 122 can determine which wordlines of the DRAM 310 need to be refreshed from the information stored in the wordline space of wordline WL0. Accordingly, during this second refresh interval, only wordlines 0, 3, and 4 are refreshed while the remaining wordlines are not. Thereafter, during a third refresh interval starting at time 128 msec. refreshing is performed again as to all wordlines 0 through 11. In such manner, only the wordline spaces associated with certain wordlines 0, 3 and 4 are refreshed at the most frequent rate, while the wordline spaces associated with the remaining wordlines are refreshed at a lower rate, which is half of the maximum rate in this example.

Figure 5:
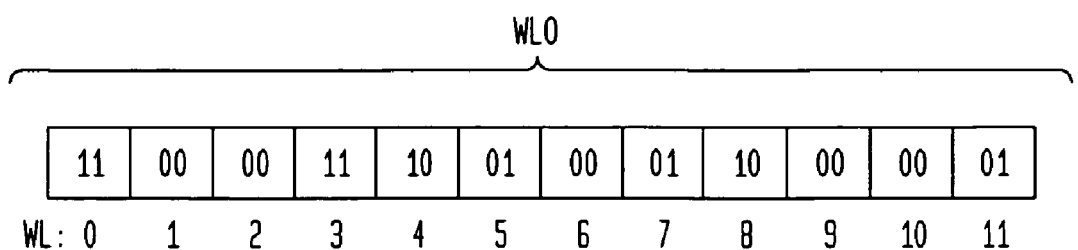
FIG. 5 is a diagram illustrating alternative stored information content of a wordline space utilized in another embodiment of the invention.

FIG. 5 illustrates an embodiment providing even greater granularity for distinguishing between portions of the DRAM to be refreshed at different rates. In this embodiment, each field of the wordline space WL0 includes two bits for indicating the refresh rate status of a wordline. By providing two bits per field, four different portions of the DRAM can be distinguished from each other, such that each portion can be refreshed at one of four different refresh rates. For example, a value of "00" can be used to indicate the lowest refresh rate. The next higher refresh rate can be indicated by a value "01". A still higher refresh rate can be indicated by the value "10" and the highest rate by the value "11".

As indicated in FIG. 5, according to the information stored in the wordline space WL0, wordlines 0 and 3 have the value "11" indicating that they are to be refreshed at the highest refresh rate, which corresponds to the primary refresh interval. Wordlines 4 and 8 have the next lower value "10" indicating that they need to be refreshed at the next lower refresh rate, for example at half the highest refresh rate. Wordlines 5, 7 and 11 have the value "01" such that they are to be refreshed at a lower rate still. Finally, wordlines 1, 2, 6, 9 and 10 have the lowest value "00" indicating that they can be refreshed at the lowest rate.

Figure 6:
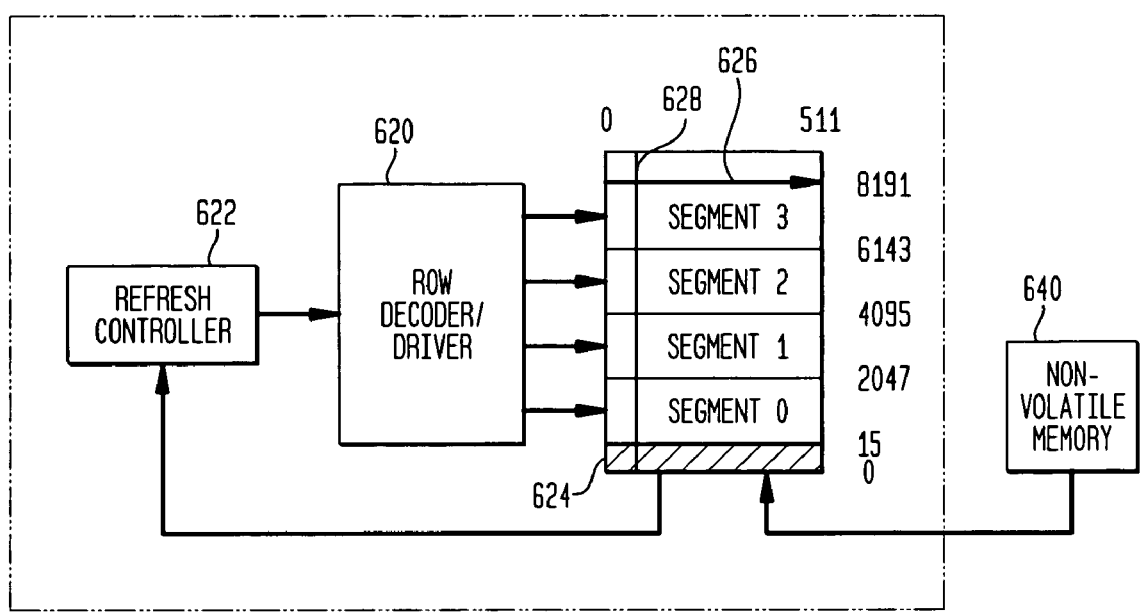
FIG. 6 is a block and schematic diagram illustrating a system for refreshing a DRAM according to an embodiment of the invention.

FIG. 6 illustrates an embodiment of the invention in which information for distinguishing between portions of a DRAM to be refreshed at different rates is stored in the DRAM itself. As shown in FIG. 6, a DRAM 610 includes a storage array or arrays which are subdivided as a plurality of segments 0 through 3. Segments 0 through 3 are accessed by a row decoder/driver unit 620. A refresh controller 622 controls the timing and addressing of refresh operations for segments 0 through 3.

Information for distinguishing between portions of the DRAM 610 to be refreshed at different rates is stored in a space 624 of segment 0 of the DRAM 610. Space 624 can be rather small in relation to the total size of the DRAM 610. In an example, DRAM 610 has a storage space accessed by a plurality of wordlines 626. Each of the four segments 0 through 3 of the DRAM 610 includes 2048 wordlines for a total of 8192 wordlines. The storage space is further accessed by a plurality of bitlines 628. In an exemplary embodiment, the DRAM includes 512 bitlines for a total capacity of four megabits (Mb).

In an embodiment, portions of the DRAM 610 are to be distinguished from each other on a wordline-by-wordline basis. In such case, assuming there is no encoding or compression of the information stored in space 624, at least one bit is needed to indicate the refresh status for each of the 8192 wordlines of the DRAM 610. In order to store one bit per wordline, it is evident that a space of only 16 wordlines are needed, since each wordline accesses 512 storage cells which store a total of 512 bits.

A non-volatile memory 640 backs up the information stored in space 624. When DRAM 610 is switched off, the information stored in space 624 will be lost. Accordingly, the non-volatile memory 640 stores the information to be loaded into space 624 when the DRAM 610 is turned on after being switched off. The non-volatile memory 640 can be of any type and can be located either on the same integrated circuit as the DRAM 610 or, more preferably, on a different integrated circuit or device having a non-volatile memory function.

As used herein, "non-volatile memory" means any memory which continues to store information despite the removal of main operational power. Non-volatile memory includes but is not limited to read only memory (ROM), programmable read only memory (PROM), electrically programmable read only memory (EPROM), non-volatile random access memories such as flash memory, and dynamic random access memory configured to remain permanently switched on (through low current standby power and/or battery back-up power, for example), magnetic disk, optical disc, magneto-optic disc, magneto-resistive random access memory (MRAM) and so forth.

In active operation when the DRAM 610 is switched on, i.e. in either active mode, or a sleep mode if such is provided, space 624 stores the information for distinguishing between portions of the DRAM to be refreshed at different rates. The refresh controller 622 accesses the stored information and then utilizes it to distinguish between the different portions of the DRAM and then refresh the respective portions at different rates. However, when the DRAM is switched off, the information stored in space 624 is lost. The non-volatile memory 640 permanently stores the necessary information. Therefore, whenever the DRAM is switched on, the information for distinguishing between the different portions of the DRAM is loaded from the non-volatile memory 640 into space 624 of the DRAM 610.

Although the invention herein has been described with reference to particular embodiments, it is to be understood that these embodiments are merely illustrative of the principles and applications of the present invention. It is therefore to be understood that numerous modifications may be made to the illustrative embodiments and that other arrange-

The invention claimed is:

1. A method of reducing a rate for refreshing a portion of a dynamic random access memory (DRAM), comprising:
providing a first portion of said DRAM comprising a plurality of volatile memory cells permitting refresh at a first rate and a second portion of said DRAM comprising a differing plurality of volatile memory cells permitting refresh at a second rate lower than said first rate;
determining, by performing testing, the first and second refresh rates that are permitted for the first and second portions;
storing information for distinguishing between said first portion and said second portion and storing information indicating the first and second refresh rates associated with the first and second portions within said DRAM; and
accessing said stored information for distinguishing between said first portion and said second portion and accessing said stored information that indicates the first and second refresh rates to determine when and to refresh said first portion at said first rate and to determine when and to refresh said second portion at said second rate.

2. A method as claimed in claim 1 wherein said first portion and said second portion each include one or more segments of said DRAM, and said information allows said first portion and said second portion to be distinguished on the basis of said segments.

3. A method as claimed in claim 1 wherein said first portion includes subportions, at least some of said subportions being physically discontiguous.

4. A method as claimed in claim 3 wherein said subportions are wordline spaces of said DRAM and said information allows said first portion and said second portion to be distinguished on the basis of said wordline spaces.

5. A method as claimed in claim 1 wherein said first portion is refreshed at said first rate and said second portion is refreshed at said second rate while both said first portion and said second portion operate in a mode selected from the group consisting of active mode and sleep mode.

6. A method as claimed in claim 1 wherein said information is further stored in a non-volatile memory and accessed from said non-volatile memory for storage in said DRAM.

7. A method as claimed in claim 1 wherein said information is stored on one or more fuses on an integrated circuit including said DRAM.

8. A method as claimed in claim 1 wherein said information further allows a plurality of portions numbering one to n of said DRAM including said first portion and said second portion to be distinguished for refreshing said plurality of portions of said DRAM at a plurality of respective rates numbering one to n, and said stored information is accessed to refresh said plurality of portions at said respective rates including to refresh said first portion at said first rate, to refresh said second portion at said second rate, and to fresh said nth portion at said nth rate.

9. A method as claimed in claim 1 wherein said information is stored in a space accessible through one or more wordlines of said DRAM.

10. A method as claimed in claim 1 wherein said information is generated by post-fabrication stress testing of said DRAM.

11. An integrated circuit including a dynamic random access memory (DRAM), comprising:
a first portion comprising a plurality of volatile memory cells requiring refresh at a first rate and a second portion comprising a different plurality of volatile memory cells permitting refresh at a second rate lower than said first rate;
electronic means operable to store information for distinguishing between said first portion and said second portion;
storage within said DRAM for storing information indicating the first rate associated with said first portion and the second rate associated with said second portion; and
a controller operable to access said stored information from said storage and said electronic means to determine when and to refresh said first portion at said first rate and to determine when and to refresh said second portion at said second rate.

12. An integrate circuit as claimed in claim 11 wherein said first portion and said second portion each include one or more segments of said DRAM, and said information allows said first portion and said second portion to be distinguished on the basis of said segments.

13. An integrated circuit as claimed in claim 11 wherein said first portion includes subportions, at least some of said subportions being physically discontiguous.

14. An integrated circuit as claimed in claim 13 wherein said subportions are wordline spaces of said DRAM such that said information allows said first portion and said second portion to be distinguished on the basis of said wordline spaces.

15. An integrated circuit as claimed in claim 11 wherein said controller is operable to refresh said first portion at said first rate and to refresh said second portion at said second rate while both said first portion and said second portion operate in a mode selected from the group consisting of active mode and sleep mode.

16. An integrated circuit as claimed in claim 11 wherein said controller is further operable to access first information from a non-volatile memory and said electronic means is further operable to store said information from said first information.

17. An integrated circuit as claimed in claim 16 wherein said electronic means includes one or more fuses.

18. An integrated circuit as claimed in claim 11 wherein said information further allows a plurality of portions numbering one to n of said DRAM including said first portion and said second portion to be distinguished for refreshing said plurality of portions of said DRAM at a plurality of respective rates numbering one to n, and said controller is operable to refresh said plurality of portions at said respective rates including to refresh said first portion at said first rate, to refresh said second portion at said second rate, and to refresh said nth portion at said nth rate.

19. An integrated circuit as claimed in claim 18 wherein said electronic means includes a space accessible through one or more wordlines of said DRAM.

* * * * *